(12) United States Patent
Ionescu et al.

(10) Patent No.: US 11,820,253 B2
(45) Date of Patent: Nov. 21, 2023

(54) ADAPTIVE BALANCING FOR BATTERY MANAGEMENT

(71) Applicant: Honeywell International Inc., Charlotte, NC (US)

(72) Inventors: Octavian Ionescu, Prahova (RO); Octavian Buiu, Bucharest (RO); Ion Georgescu, Bucharest (RO); Viorel Georgel Dumitru, Prahova (RO); Bogdan-Catalin Serban, Bucharest (RO); Mihai Brezeanu, Bucharest (RO); Matei Serbanescu, Bucharest (RO)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 0 days.

(21) Appl. No.: 17/224,389

(22) Filed: Apr. 7, 2021

(65) Prior Publication Data

US 2021/0221251 A1 Jul. 22, 2021

Related U.S. Application Data

(63) Continuation of application No. 15/820,858, filed on Nov. 22, 2017, now Pat. No. 11,034,259.

(51) Int. Cl.
*B60L 58/22* (2019.01)
*G01R 31/382* (2019.01)
*H02J 7/36* (2006.01)

(52) U.S. Cl.
CPC ............ *B60L 58/22* (2019.02); *G01R 31/382* (2019.01); *H02J 7/36* (2013.01); *Y02T 10/70* (2013.01)

(58) Field of Classification Search
CPC .......... B60L 58/22; G01R 31/382; H02J 7/36; Y02T 10/70
See application file for complete search history.

(56) References Cited

U.S. PATENT DOCUMENTS

| 10,833,513 B2* | 11/2020 | Coenen ................. H02J 7/0018 |
| 11,125,827 B2* | 9/2021 | Wild .................... G01R 31/367 |
| 2008/0211459 A1 | 9/2008 | Choi |
| 2009/0085515 A1 | 4/2009 | Bourilkov et al. |

(Continued)

FOREIGN PATENT DOCUMENTS

| JP | 2010-141956 A | 6/2010 |
| WO | 2016/012922 A1 | 1/2016 |

OTHER PUBLICATIONS

Annex to the Invitation Pursuant to Rule 13 7(4) and Article 94(3) issued in European Application No. 16203528.1 dated Feb. 23, 2021, 1 page.

(Continued)

*Primary Examiner* — Daniel Kessie
*Assistant Examiner* — Brian K Baxter
(74) *Attorney, Agent, or Firm* — Alston & Bird LLP (57) ABSTRACT

A battery balancing system includes an energy balancing circuit. Multiple battery cells are coupled to the energy balancing circuit. A health assessment circuit is coupled to the multiple battery cells and configured to sense a state of health and a charge of each of the multiple battery cells. The balancing circuit switches energy between the multiple battery cells as a function of the sensed state of health and state of charge of each of the multiple battery cells to balance charge there between.

20 Claims, 6 Drawing Sheets

(56) References Cited

U.S. PATENT DOCUMENTS

| | | | |
|---|---|---|---|
| 2010/0244781 A1* | 9/2010 | Kramer | H02J 7/0016 320/162 |
| 2010/0261043 A1* | 10/2010 | Kim | H01M 10/4257 429/61 |
| 2010/0305793 A1 | 12/2010 | Kidston et al. | |
| 2012/0133337 A1 | 5/2012 | Rombouts et al. | |
| 2012/0187898 A1 | 7/2012 | Nysen | |
| 2013/0009648 A1* | 1/2013 | Tae | G01R 31/3278 324/503 |
| 2013/0221919 A1 | 8/2013 | Gallegos et al. | |
| 2013/0278218 A1* | 10/2013 | Onnerud | H02J 7/0016 320/118 |
| 2014/0002005 A1* | 1/2014 | Sutardja | H02J 7/00302 320/103 |
| 2014/0055079 A1 | 2/2014 | Lee | |
| 2014/0239901 A1* | 8/2014 | De Cock | H02J 7/0019 320/119 |
| 2014/0354212 A1 | 12/2014 | Sugeno et al. | |
| 2015/0028816 A1 | 1/2015 | Lee | |
| 2015/0171643 A1* | 6/2015 | Makishi | H02J 7/0016 320/116 |
| 2015/0369874 A1 | 12/2015 | Park et al. | |
| 2016/0107526 A1* | 4/2016 | Jin | B60L 50/60 307/10.1 |
| 2017/0098940 A1* | 4/2017 | Syouda | H02J 7/0016 |
| 2017/0163035 A1 | 6/2017 | Zhyhinas et al. | |
| 2017/0163160 A1* | 6/2017 | Din | H02J 7/0018 |
| 2017/0219660 A1 | 8/2017 | Christensen et al. | |
| 2017/0331323 A1 | 11/2017 | Ehrmantraut | |
| 2017/0346334 A1* | 11/2017 | Mergener | H02J 7/0016 |
| 2018/0269542 A1 | 9/2018 | Muenzel et al. | |
| 2018/0366959 A1* | 12/2018 | Coenen | G01R 31/392 |
| 2019/0199117 A1* | 6/2019 | Yang | H02J 50/10 |

OTHER PUBLICATIONS

Extended European Search Opinion issued in European Application No. 16203528.1 dated Nov. 8, 2017, 7 pages.

Extended European Search Report issued in European Application No. 16203528.1 dated Nov. 8, 2017, 4 pages.

Final Rejection dated Jan. 12, 2021 for U.S. Appl. No. 15/820,858.

Final Rejection dated Jul. 21, 2020 for U.S. Appl. No. 15/820,858.

Invitation Pursuant to Rule 137(4) and Article 94(3) issued in European Application No. 16203528.1 dated Feb. 23, 2021, 3 pages.

Non-Final Rejection dated Dec. 30, 2019 for U.S. Appl. No. 15/820,858.

Non-Final Rejection dated Oct. 1, 2020 for U.S. Appl. No. 15/820,858.

Notice of Allowance and Fees Due (PTOL-85) dated Mar. 2, 2021 for U.S. Appl. No. 15/820,858.

Notice of Allowance and Fees Due (PTOL-85) dated Mar. 30, 2021 for U.S. Appl. No. 15/820,858.

Partial European Search Report issued in European Application No. 16203528.1 dated Aug. 30, 2017, 13 pages.

Decision to grant a European patent received for European Application No. 16203528.1, dated May 19, 2022, 2 pages.

Communication about intention to grant a European patent received for EP Application No. 16203528.1, dated Jan. 11, 2022, 6 pages.

Extended European search report dated Oct. 31, 2022 for EP Application No. 22167723, 12 pages.

* cited by examiner

ADAPTIVE BALANCING FOR BATTERY MANAGEMENT

1. PRIORITY CLAIM

This application is a continuation application of, and claims priority to U.S. patent application Ser. No. 15/820,858 entitled ADAPTIVE BALANCING FOR BATTERY MANAGEMENT filed on Nov. 22, 2017 which claims priority to European Patent Office Application number 16203528.1 (entitled ADAPTIVE BALANCING FOR BATTERY MANAGEMENT, filed Dec. 12, 2016) each of which are incorporated herein by reference.

BACKGROUND

Batteries are a main source of energy for hybrid or electric vehicles, mobile radio stations, laptops and many other electronic devices. Concerns regarding environmental issues as well as the shortage of Lithium (Li) ore on Earth are the driving forces to maximizing the effectiveness in using these batteries and not the least in extending their life. In most of applications Li Ion batteries consists of matrix of cells connected in series and/or parallel. Each battery cell has its own peculiarities. A battery cell state of health (SoH) is different due to different aging, and therefore battery cell behavior in the pack will be different.

State of health is a complex concept which includes monitoring the degradation of the battery over time. The primary way that SoH is determined is by comparing the total capacity of the battery under consideration to the capacity of a new battery, taking into account such factors as charge acceptance, internal resistance, voltage, and self-discharge rate.

To improve battery lifespan, manufacturers take pains to ensure that all cells of a battery are as similar as possible to each other in order to prevent cell imbalance. Generally, cell imbalance is when the SoC of cells in a string are mismatched either due to inconsistent capacities or uneven initial SOC, resulting in either degraded pack performance relative to the weakest cell or the abuse of the weak cell by the operation of the rest of the pack. Since no two cells are exactly identical due to differences in SoC, self-discharge rate, capacity, impedance, and temperature characteristics' SoC divergence is a distinct possibility within a string of cells.

Many batteries packs, particularly large strings with high power and frequent cycling requirements, have a battery management system (BMS) to monitor and protect against overcharge, over discharge, excessive current rates, extreme temperatures, cell imbalance and other safety factors dependent on the battery chemistry. There are already developed BMS which perform active or passive cell balancing. In passive balancing, current is directed around cells which are 'full' — at 100% SOC— and shunted through resistors.

This method is very cheap to implement but not very effective at balancing batteries with substantial variation in SoC, as well as being wasteful of energy, as higher energy cells shed excess energy via resistors, generating heat. However, one of the main purposes of a BMS is to prevent the loss of energy that could be stored, so while this method is good for protecting the health and lifespan of the battery it may be undesirable depending on the application.

Conditioning charges may be considered to be a form of passive balancing, since such charges serve that purpose. The use of conditioning charges, however, is not particularly energy efficient as such charges may typically utilize passive balancers functioning only during the charge cycle.

Sorted by circuit topology there are three types of active balancers: the shunting method, the shuttling method, and the energy converter method. The shunting method is similar to the passive shunting method described above but instead of changing current flow immediately upon reaching a certain voltage for a given cell, the current is proportionally shunted away through resistors. The shuttling method involves capacitive or inductive charge shuttling from cells with high SOC to cells with low SOC, and can be much more efficient for batteries with frequent charge-discharge cycling. The energy converter method is defined by some as isolated converters where the input and output side of the converters have isolated grounds. However, the power wasted in standby may be greater for active balancing than for passive due to inaccurate measurements and switching phenomenon.

Further problems associated with active balancing include that balancing cannot be performed on adjacent cells at the same time. The switches used to perform the balancing may also be exposed to high drain-to-source voltage that exceeds what the switch can sustain.

SUMMARY

A battery balancing system includes an energy balancing circuit. Multiple battery cells are coupled to the energy balancing circuit. A health assessment circuit is coupled to the multiple battery cells and configured to sense a state of health and a charge of each of the multiple battery cells. The balancing circuit switches energy between the multiple battery cells as a function of the sensed state of health and state of charge of each of the multiple battery cells to balance charge there between.

A computer implemented method includes receiving state of health and state of charge measurements for multiple cells of a multiple cell battery, calculating an amount of energy to transfer between cells, determining switch controls of an energy balancing circuit responsive to the calculated energy transfer, and controlling the switches to transfer the calculated amount of energy.

A device includes a processor and a memory device coupled to the processor and having a program stored thereon. The program is executable by the processor to receive state of health and state of charge measurements for multiple cells of a multiple cell battery, calculate an amount of energy to transfer between cells, determine switch controls of an energy balancing circuit responsive to the calculated energy transfer, and control the switches to transfer the calculated amount of energy.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software in one embodiment. The software may consist of computer executable instructions stored on computer readable media or computer readable storage device such as one or more non-transitory memories or other type of hardware based storage devices, either local or networked. Further, such functions correspond to modules, which may be software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system, turning such computer system into a specifically programmed machine.

A smart adaptive balancing system may provide benefits to save energy and extend the lifetime of battery pack by maintaining cell balance, all of cells of a battery in an adaptive manner taking into consideration phenomenon which may occur due to the aging of battery.

The balancing system continuously monitors the status of each cell of the battery, identifies the parameters of each cell (SoH and SoC), and through a smart adaptive algorithm controls the delivery of the energy from the fully charged cells to the cells with a deficit of energy thus realizing a balanced SoC for all cells consequently providing life extension for the battery pack as well as significant energy saving.

Correlating the SoH with the quantity of energy to be received by the less charged cells from the fully charged cells may be accomplished using a well-established transfer function which characterizes the SoH of the battery, to compare the calculated results with the measured parameters of the battery and thus controls the charging of all the elements adapted to their state of charge and state of health.

In various embodiments, the system includes an electronic system which monitors the SoH and SoC status of battery cells through any of several available methods (impedance spectroscopy, internal resistance measurement and/or charging discharging time measurement), an electrical circuit which interconnects the batteries cells in a configuration which gives the possibility of transferring the power from the cells with exceeding energy to the cell with deficit of energy in a controlled manner. The system may provide wireless information to a vehicle driver and/or to the battery SoC monitoring center avoiding its premature aging/destruction.

When the monitoring system detects that one specific cell presents modification of SoH will modify accordingly the modulation of charge transfer from the other cells with a better SoH in a manner to avoid charging it with high currents. In various embodiments, the system may comprise an independent module installed on each battery pack. The module may be installed on the battery casing and may be re-used after the cells reach an end of life cycle, such as by replacing the cells with new cells.

Figure 1:
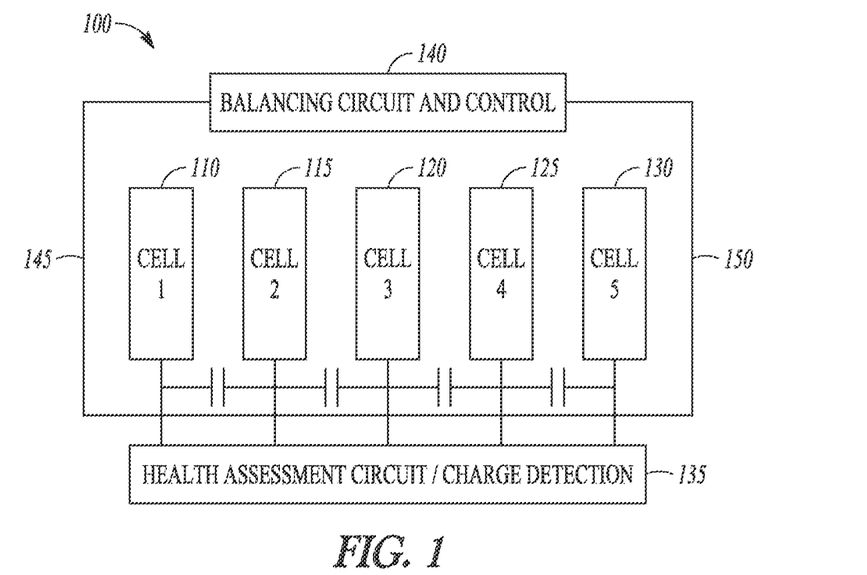
FIG. 1 is a block schematic diagram of an adaptive balancing control system for a battery that includes multiple cells according to an example embodiment.

FIG. 1 is a block schematic diagram of an adaptive balancing control system 100 for a battery that includes multiple cells. That battery in this simple embodiment includes five cells that are indicated at 110, 115, 120, 125, and 130, with labels CELL 1, CELL 2, CELL 3, CELL 4, and CELL 5 respectively. As indicated above, it is difficult to match cells perfectly, such that their state of health is always the same. Thus, situations may arise where charging the cells results in CELL 1 being charted to 100%, CELL 2 to 110%, CELL 3 to 80%, CELL 4 to 90%, and cell 5 to 110%. This is just one example of charges that may result from no balancing occurring during charging. Similarly, when discharging occurs, such as the battery providing energy for a length of time, the cells may discharge unevenly, resulting in respective charges of 0%, 20%, −10%, 0% and −10%. Overcharging and overdrained cells may further adversely affect individual cell state of health and lead to early end of life for the entire battery.

A circuit 135 is used to perform both a health assessment and charge detection in one embodiment. The health assessment may be performed by impedance spectroscopy using a specialized integrated circuit (IC), such as Analog Devices AD 350 in one embodiment. In further embodiments both the SoH and SoC status of battery cells may be provided through any of several available methods (impedance spectroscopy, internal resistance measurement and/or charging discharging time measurement).

A balancing circuit 140 is coupled to the cells and to the health assessment and charge detection circuit. The balancing circuit determines what cells to transfer energy to and from via lines 145 and 150, which provide suitable switching circuitry to transfer energy from a selected cell to another cell responsive to information provided by the circuit 135 regarding SoH and SoC. The energy switching may occur any time during charging as well as discharging, and may take many forms. In some embodiments, energy is transferred from the cell with the highest charge to the cell with the lowest charge. In further embodiments, energy may be transferred from one or more cells with the highest charge to one or more cells with lower charges.

Figure 2:
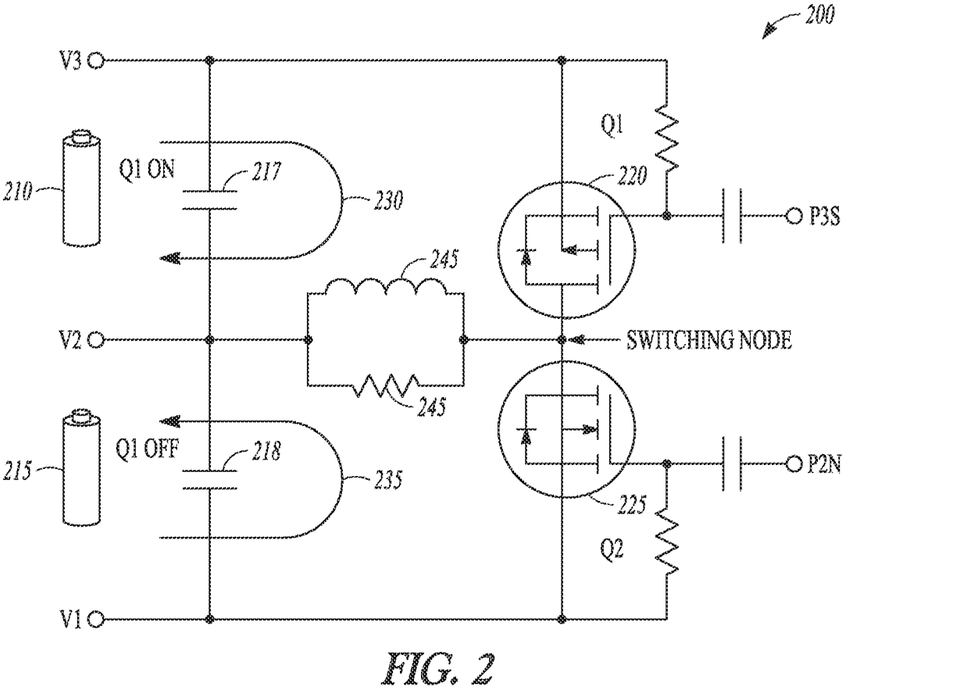
FIG. 2 is a schematic diagram of an active balancing circuit according to an example embodiment.

In one embodiment, an active balancing circuit as shown at 200 in FIG. 2 may be used to transfer energy between adjacent cells in a controlled manner to avoid switching problems. Active balancing circuit 200 in one embodiment is shown between a first cell 210 and a second cell 215. A first switch 220, Q1 is coupled in parallel with first cell 210 and a second switch 225, Q2, is coupled in parallel with second cell 215. The cells are coupled in series as represented by charge storage devices, capacitors 217 and 218 respectively such that their voltages add. By utilizing capacitive or inductive charge shuttling between the cells, charge may be balanced. By controlling the first and second switches 220 and 225 in accordance with measured SoC and SoH, the charge may be shuttled much more efficiently than in prior active balancing circuits. With Q1 on and Q2 off, current flows from CELL 1 to CELL 2 when CELL 2 has a lower charge than CELL 1 as indicated by arrows 230 and 235. In one embodiment, the current flows through a resistor 240 and inductor 245 coupled in parallel.

The amount of charge to transfer may be determined by the balancing circuit 140, which is broken into battery management system controller 250 and an energy control 255. Inductor 245 stores an amount of energy, Q, which is stored in the inductance L of inductor 245. This energy is transferred from a battery such as battery 210 to another battery, such as battery 215. In one embodiment, a coil of inductor 245 is wrapped on a ferrite core 260. An additional coil 265 is also magnetically coupled to the ferrite core 260 and is used to pre-magnetize the ferrite core 260 by running current through coil 265 via energy control 255 as controlled by controller 250. This allows control via energy control 255 of the amount of energy to be transferred via the inductor 245 in accordance with the following equation:

$$\text{Energy stored} = \int_0^t P dt = * \int_0^t Li' di' = \frac{1}{2} LI^2.$$

Figure 3:
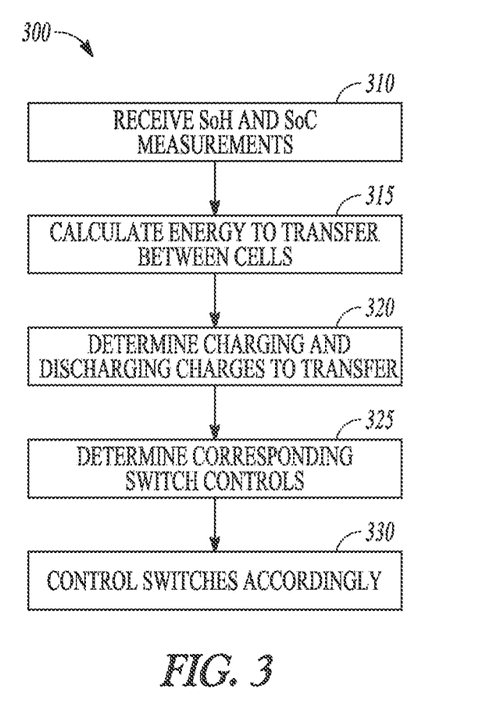
FIG. 3 is a flowchart illustrating a method of adaptive balancing control according to an example embodiment.

FIG. 3 is a flowchart illustrating a method 300 of adaptive balancing control such as may be implemented by balancing circuit 140. At 310, SoH and SoC measurements are received from circuit 135. The measurement are used to calculate an amount or quantity of energy to be delivered to and from each cell at 315 without exceeding maximum and minimum charges for each cell. At 320, charging and discharging charges are determined based on the amount of energy to be delivered to and from each cell. Cells that have less charge than other cells generally are identified to receive charge from cells that have more charge than other cells. Cells with higher charge are identified and can provide more charge than cells with lower charge.

In various embodiments, a table lookup may be used based on SoH and SoC to determine the charge to be transferred between two cells. At 325, switch controls are determined to accomplish the charge transfers. The switches are then controlled at 330 responsive to the determined switch controls to accomplish the charge transfers. The process may then be repeated based on SoH and SoC following the charge transfers, or in real time as charge is being transferred, to adjust switch controls.

Figure 4:
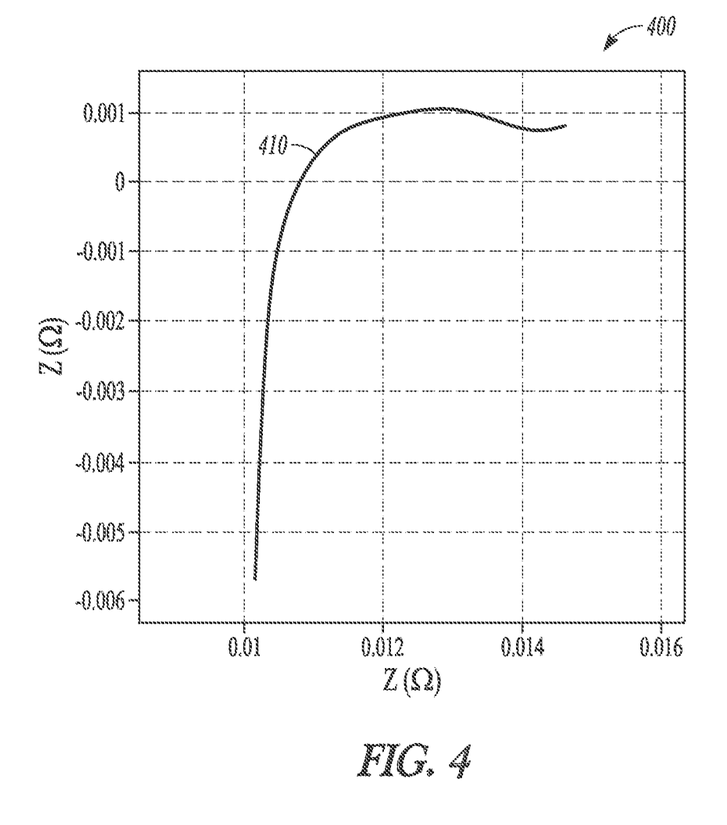
FIG. 4 is a graph illustrating an example impedance curve of an impedance spectroscopy measuring impedance characteristics of a battery or cell of a battery according to an example embodiment.
Figure 5:
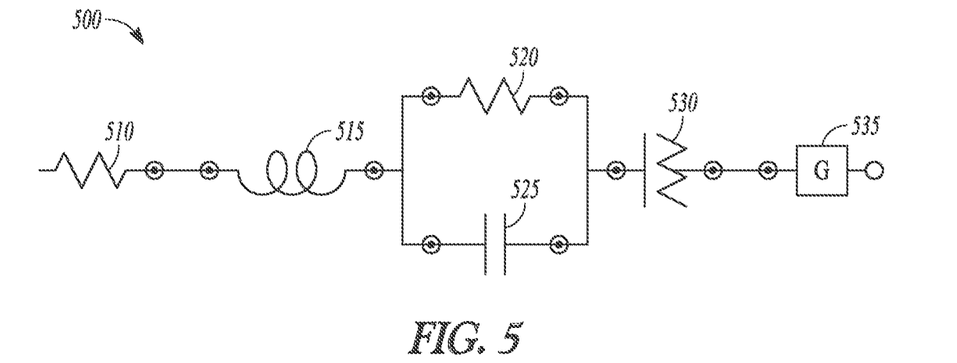
FIG. 5 is a schematic diagram of an equivalent circuit of a battery according to an example embodiment.

FIG. 4 is a graph 400 illustrating an example impedance curve 410 of an impedance spectroscopy measuring impedance characteristics of a battery or cell of a battery. From the impedance measurements, an equivalent circuit 500 of the battery or cell may be established as indicated in the circuit diagram of FIG. 5. The equivalent circuit 500 includes a series coupled resistor 510 and inductor 515. A further parallel coupled resistor 520 and capacitor 525 are also coupled in series with the resistor 510 and inductor 515. An impedance 530 and voltage 535 are also coupled in series with the prior electrical elements.

Figure 6:
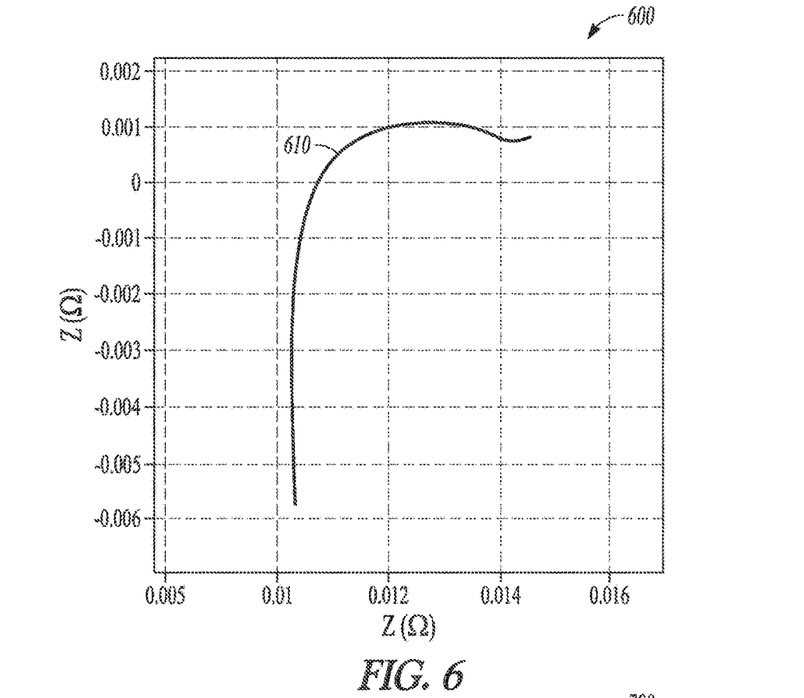
FIG. 6 is a graph illustrating an impedance curve generated from the equivalent circuit to verify a fitting between impedance curves according to an example embodiment.
Figure 7:
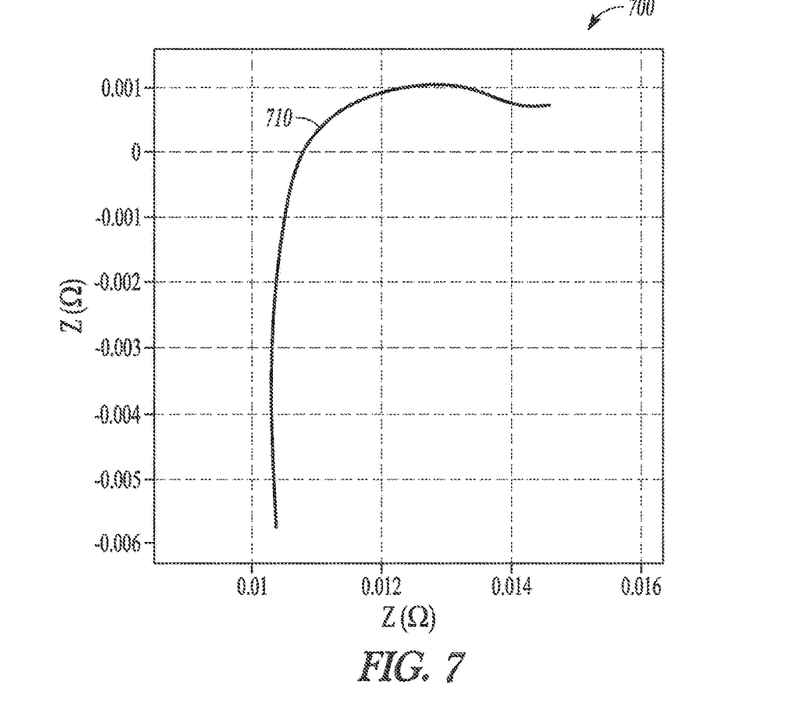
FIG. 7 is a graph illustrating an impedance curve of a model of the equivalent circuit of FIG. 5 according to an example embodiment.

FIG. 6 is a graph 600 illustrating an impedance curve 610 generated from the equivalent circuit 500 to verify a fitting between the impedance curves 410 and 610. A mathematical model of the equivalent circuit 500 may then be generated, and example results of the model are shown in FIG. 7, which is a graph 700 illustrating an impedance curve 710 of the model.

Figure 8:
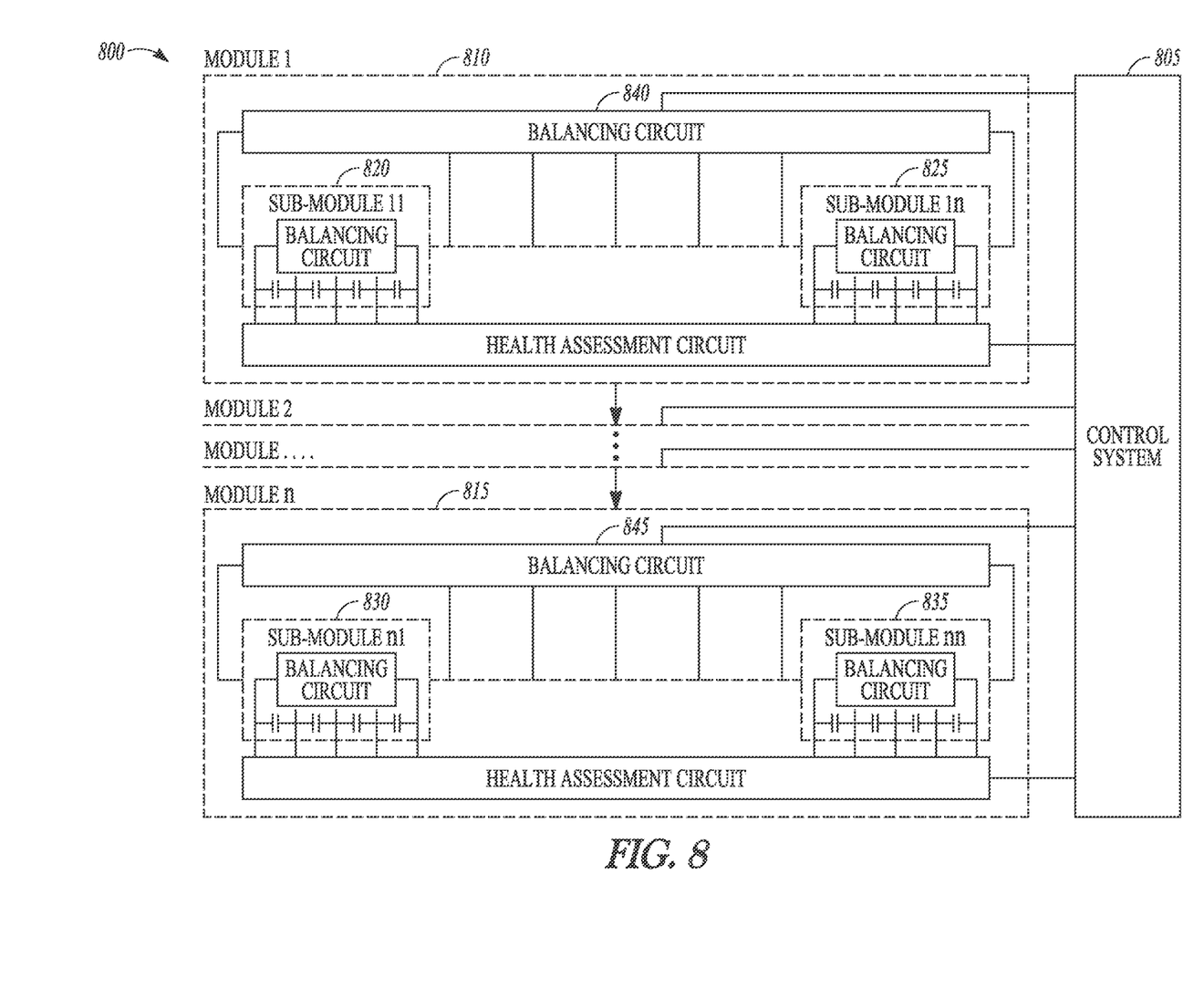
FIG. 8 is a block schematic diagram of a battery system according to an example embodiment.

FIG. 8 is a block schematic diagram of a battery system 800 according to an example embodiment. Battery system 800 includes a controller 805 that is coupled to multiple battery modules 810 to 815. Each module may include one or more sub-modules such as indicated at 820, 825, 830, and 835. Each sub-module may have multiple battery cells. The modules and submodules maybe coupled in any manner to provide desired battery electrical capabilities, including voltage and current capabilities.

In one embodiment, each module may have a balancing circuit as indicated at 840 and 845 as well as health assessment circuit 850 and 855 capable of measuring SoH and SoC of each cell. The control system 805 may receive measurements from the health assessment circuits 850 and 855, and determine how much charge to transfer between the various cells. The transfers may take place between adjacent cells, cells in the same sub-module, cells in different sub-modules of the same module, and cells in different modules in various embodiments, driven by the measured Soh and SoC of the various cells in order to optimize overall charge storage and life of the battery system 800 without exceeding maximum and minimum charge limitations of each cell.

In various embodiments, a smart, adaptive, balancing system for (BMS) battery management system includes an electronic system which monitors the SoC of battery cells through any of available methods (impedance spectroscopy, internal resistance measurement and/or charging discharging time measurement), an electrical circuit which interconnects the batteries cells in a configuration transfer the power from the cells with exceeding energy to the cell or cells with deficit of energy in a controlled manner, and an electronic system which controls and commands the charge transfer from cell to cell.

In some embodiments, an electronic system provides a wireless link between the battery management system and a battery monitoring center and/or operator. In some embodiments, a method and algorithm provides battery cell SoH detection and adaptive balancing control.

Figure 9:
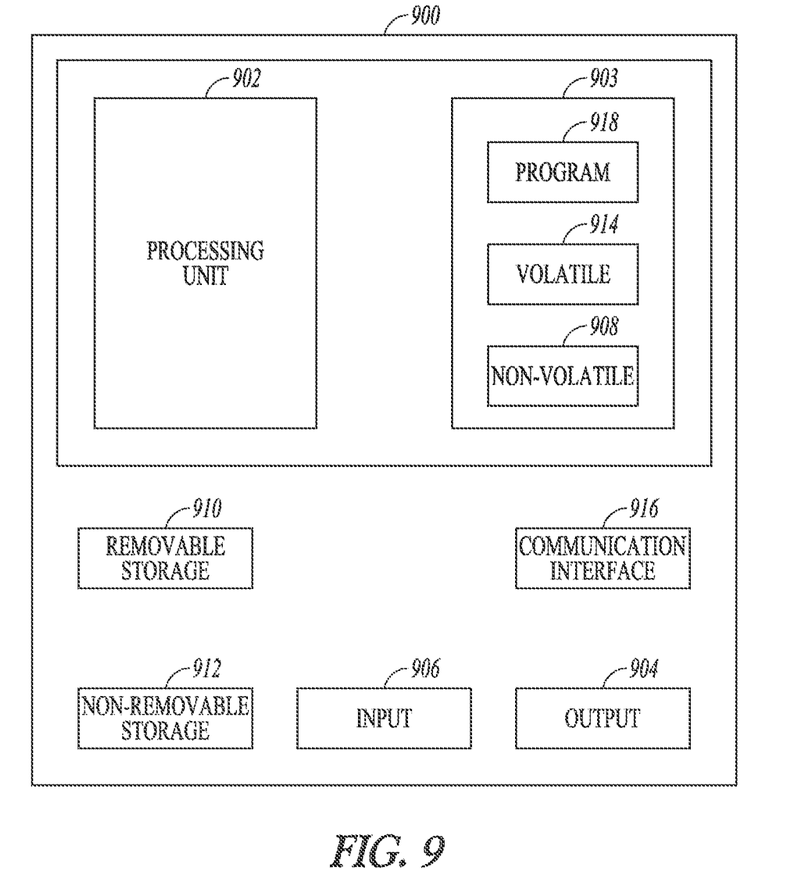
FIG. 9 is a block schematic diagram of a computer system to implement components of a smart adaptive balancing system according to a example embodiments.

FIG. 9 is a block schematic diagram of a computer system 900 to implement components of the smart adaptive balancing system, including the control system, and methods according to example embodiments. All components need not be used in various embodiments. One example computing device in the form of a computer 900, may include a processing unit 902, memory 903, removable storage 910, and non-removable storage 912. Although the example computing device is illustrated and described as computer 900, the computing device may be in different forms in different embodiments. For example, the computing device may instead be a smartphone, a tablet, smartwatch, or other computing device including the same or similar elements as illustrated and described with regard to FIG. 9. Devices such as smartphones, tablets, and smartwatches are generally collectively referred to as mobile devices. Further, although the various data storage elements are illustrated as part of the computer 900, the storage may also or alternatively include cloud-based storage accessible via a network, such as the Internet.

Memory 903 may include volatile memory 914 and non-volatile memory 908. Computer 900 may include—or have access to a computing environment that includes—a variety of computer-readable media, such as volatile memory 914 and non-volatile memory 908, removable storage 910 and non-removable storage 912. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

Computer 900 may include or have access to a computing environment that includes input 906, output 904, and a communication connection 916. Output 904 may include a display device, such as a touchscreen, that also may serve as an input device. The input 906 may include one or more of a touchscreen, touchpad, mouse, keyboard, camera, one or more device-specific buttons, one or more sensors integrated within or coupled via wired or wireless data connections to the computer 900, and other input devices. The computer may operate in a networked environment using a communication connection to connect to one or more remote computers, such as database servers, including cloud based servers and storage. The remote computer may include a personal computer (PC), server, router, network PC, a peer device or other common network node, or the like. The communication connection may include a Local Area Network (LAN), a Wide Area Network (WAN), cellular, WiFi, Bluetooth, or other networks.

Computer-readable instructions stored on a computer-readable storage device are executable by the processing unit 902 of the computer 900. A hard drive, CD-ROM, and RAM are some examples of articles including a non-transitory computer-readable medium such as a storage device. The terms computer-readable medium and storage device do not include carrier waves. For example, a computer program 918 may be used to cause processing unit 902 to perform one or more methods or algorithms described herein.

EXAMPLES

In example 1, battery balancing system includes an energy balancing circuit. Multiple battery cells are coupled to the energy balancing circuit. A health assessment circuit is coupled to the multiple battery cells and configured to sense a state of health and a charge of each of the multiple battery cells. The balancing circuit switches energy between the multiple battery cells as a function of the sensed state of health and state of charge of each of the multiple battery cells to balance charge there between.

Example 2 includes the battery balancing system of example 1 wherein the energy balancing circuit includes multiple switches controllable to route energy between selected cells of the multiple battery cells.

Example 3 includes the battery balancing system of example 2 and further comprising a controller coupled to the energy balancing circuit and the health assessment circuit to determine an amount of charge to transfer between cells and to control the switches to effect the determined transfer.

Example 4 includes the battery balancing system of example 3 wherein the health assessment circuit continuously senses the state of health and state of charge of each battery cell and the controller continuously updates switch settings.

Example 5 includes the battery balancing system of any of examples 3-4 wherein the balancing circuit switches energy between the multiple battery cells without exceeding minimum and maximum charges for each cell.

Example 6 includes the battery balancing system of any of examples 3-5 wherein the health assessment system comprises an impedance spectroscopy circuit.

Example 7 includes the battery balancing system of any of examples 3-6 wherein the health assessment system comprises circuitry to perform an internal resistance measurement to determine state of health of each cell.

Example 8 includes the battery balancing system of any of examples 3-7 wherein the health assessment system comprises circuitry to perform charging discharging time measurement to determine state of charge of each cell.

Example 9 includes the battery balancing system of any of examples 3-8 wherein the multiple battery cells comprises a sub-module, and wherein multiple sub-modules are coupled to form a module coupled to the energy balancing circuit and health assessment circuit.

Example 10 includes the battery balancing system of example 9 wherein the balancing circuit is operable under control of the controller to switch energy between cells of different sub-modules.

Example 11 includes the battery balancing system of example 10 and further comprising multiple additional modules coupled to the controller.

In example 12 a computer implemented method includes receiving state of health and state of charge measurements for multiple cells of a multiple cell battery, calculating an amount of energy to transfer between cells, determining switch controls of an energy balancing circuit responsive to the calculated energy transfer, and controlling the switches to transfer the calculated amount of energy.

Example 13 includes the computer implemented method of example 12 wherein energy is transferred during charging or discharging of the cells.

Example 14 includes the computer implemented method of any of examples 12-13 wherein the state of health and state of charge of each battery cell is continuously received and wherein the switches are continuously controlled responsive to the continuously received state of health and state of charge.

Example 15 includes the battery balancing system of any of examples 12-14 wherein energy is switched between the multiple battery cells without exceeding minimum and maximum charges for each cell.

Example 16 includes the battery balancing system of any of examples 12-15 wherein the received state of health and state of charge are measured by impedance spectroscopy.

In Example 17 a device includes a processor and a memory device coupled to the processor and having a program stored thereon. The program is executable by the processor to receive state of health and state of charge measurements for multiple cells of a multiple cell battery, calculate an amount of energy to transfer between cells, determine switch controls of an energy balancing circuit responsive to the calculated energy transfer, and control the switches to transfer the calculated amount of energy.

Example 18 includes the device of example 17 wherein energy is transferred during charging or discharging of the cells.

Example 19 includes the device of any of examples 17-18 wherein the state of health and state of charge of each battery cell is continuously received and wherein the switches are continuously controlled responsive to the continuously received state of health and state of charge.

Example 20 includes the device of any of examples 17-19 wherein energy is switched between the multiple battery cells without exceeding minimum and maximum charges for each cell and wherein the received state of health and state of charge are measured by impedance spectroscopy.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

What is claimed is:

1. A battery balancing system comprising:
at least a first battery cell and a second battery cell; and
an independent module comprising:
a health assessment circuit coupled to each of the first battery cell and the second battery cell, wherein the health assessment circuit is configured to sense a health state and a charge state of each of the first battery cell and the second battery cell; and
an energy balancing circuit coupled to a plurality of battery cells, wherein the energy balancing circuit is configured to:
determine an amount of charge to be transferred from the first battery cell having a higher charge, to the second battery cell, having a lower charge, based on the respective health states of the first battery cell and the second battery cell, wherein the amount of charge is determined such that the amount of charge does not exceed a maximum charge for the second battery cell and a minimum charge for the first battery cell when transferred from the first battery cell to the second battery cell, and
in response to identifying a modification in the health state of the first battery cell and the second battery cell during the transfer of the amount of charge from the first battery cell to the second battery cell, modify the amount of charge to be transferred from the first battery cell to the second battery cell, in real time,
wherein the independent module is installed on a casing of a battery.

2. The battery balancing system of claim 1, wherein the energy balancing circuit switches energy using capacitive and/or inductive charge shuttling between the first battery cell and the second battery cell.

3. The battery balancing system of claim 1, wherein the energy balancing circuit further comprises a controller and multiple switches, wherein the controller is configured to determine the amount of charge and the modified amount of charge and control the multiple switches to affect the transfer of the amount of charge and the modified amount of charge.

4. The battery balancing system of claim 3, wherein the health assessment circuit continuously senses the health state and the charge state of each of the first battery cell and the second battery cell and the controller continuously updates switch settings.

5. The battery balancing system of claim 3, wherein the energy balancing circuit is configured to use a table lookup based on SoH and SoC to determine the amount of charge to be transferred between the first battery cell and the second battery cell.

6. The battery balancing system of claim 3, wherein the health assessment circuit comprises an impedance spectroscopy circuit.

7. The battery balancing system of claim 3, wherein the health assessment circuit comprises circuitry configured to perform an internal resistance measurement to determine the health state of each of the first battery cell and the second battery cell.

8. The battery balancing system of claim 3, wherein the health assessment circuit comprises circuitry configured to perform charging discharging time measurements to determine the charge state of each of the first battery cell and the second battery cell.

9. The battery balancing system of claim 3, wherein each of the first battery cell and the second battery cell comprises one or more sub-modules, and wherein the one or more sub-modules are coupled to form a module coupled to the energy balancing circuit and the health assessment circuit.

10. The battery balancing system of claim 1, wherein the energy balancing circuit is operable under control of a controller to transfer at least one of the amount of charge and the modified amount of charge from the first battery cell to the second battery cell.

11. The battery balancing system of claim 9, further comprising multiple additional modules coupled to the controller.

12. A computer implemented method comprising:
receiving, by a health assessment circuit, a health state measurement and a charge state measurement for at least a first battery cell and a second battery cell of a multiple cell battery;
calculating, by an energy balancing circuit, an amount of charge to be transferred from the first battery cell, having a higher charge, to the second battery cell, having a lower charge, based on the respective health state measurements of the first battery cell and the second battery cell, wherein the amount of charge is determined such that the amount of charge does not exceed a maximum charge for the second battery cell and a minimum charge for the first battery cell when transferred from the first battery cell to the second battery cell; and
in response to identifying a modification in the health state measurement of the first battery cell and the second battery cell during the transfer of the amount of charge from the first battery cell to the second battery cell, modifying the amount of charge to be transferred from the first battery cell to the second battery cell, in real time,
wherein the multiple cell battery comprises an independent module installed on a casing of the multiple cell battery, the independent module comprising the health assessment circuit and the energy balancing circuit.

13. The computer implemented method of claim 12, further comprising transferring at least one of the amount of charge and the modified amount of charge during charging or discharging of the first battery cell and the second battery cell.

14. The computer implemented method of claim 12, wherein the health state measurement and the charge state measurement of each of the first battery cell and the second battery cell is continuously received.

15. The computer implemented method of claim 12, wherein the energy balancing circuit switches energy using capacitive and/or inductive charge shuttling between the first battery cell and the second battery cell.

16. The computer implemented method of claim 12, wherein the received health state measurement and the received charge state measurement are measured by impedance spectroscopy.

17. A device comprising:
a processor; and
a memory device coupled to the processor and having a program stored thereon for execution by the processor to:

receive, by a health assessment circuit, a health state measurement and a charge state measurement for at least a first battery cell and a second battery cell;

calculate, by an energy balancing circuit, an amount of charge to be transferred from the first battery cell, having a higher charge, to the second battery cell, having a lower charge, based on the respective health state measurements of the first battery cell and the second battery cell, wherein the amount of charge is determined such that the amount of charge does not exceed a maximum charge for the second battery cell and a minimum charge for the first battery cell when transferred from the first battery cell to the second battery cell; and in response to identifying a modification in the health state measurement of the first battery cell and the second battery cell during the transfer of the amount of charge from the first battery cell to the second battery cell, modify the amount of charge to be transferred from the first battery cell to the second battery cell, in real time, wherein a battery comprises an independent module installed on a casing of the battery, the independent module comprising the health assessment circuit and the energy balancing circuit.

18. The device of claim 17, wherein at least one of the amount of charge and the modified amount of charge is transferred during charging or discharging of the first battery cell and the second battery cell.

19. The device of claim 17, wherein the health state measurement and the charge state measurement of each of the first battery cell and the second battery cell is continuously received.

20. The device of claim 17, wherein the received health state measurement and the received charge state measurement are measured by impedance spectroscopy.

* * * * *

UNITED STATES PATENT AND TRADEMARK OFFICE
CERTIFICATE OF CORRECTION

PATENT NO. : 11,820,253 B2
APPLICATION NO. : 17/224389
DATED : November 21, 2023
INVENTOR(S) : Ionescu et al.

Page 1 of 1

It is certified that error appears in the above-identified patent and that said Letters Patent is hereby corrected as shown below:

On the Title Page

Item (30) Column 1 Insert the following:
--(30) Foreign Application Priority Data
Dec. 12, 2016 (EP) .............................16203528--.

Signed and Sealed this
Twenty-fourth Day of September, 2024

Katherine Kelly Vidal
*Director of the United States Patent and Trademark Office*